US010888018B2

(12) United States Patent
Yu et al.

(10) Patent No.: US 10,888,018 B2
(45) Date of Patent: Jan. 5, 2021

(54) CHECK VALVE FOR PREVENTING AIR BACKFLOW IN A MODULAR COOLING SYSTEM

(71) Applicant: Fortinet, Inc., Sunnyvale, CA (US)

(72) Inventors: Qian Yu, Burnaby (CA); Chenghua Hong, Vancouver (CA); Keqin Chen, Coquitlam (CA)

(73) Assignee: Fortinet, Inc., Sunnyvale, CA (US)

( * ) Notice: Subject to any disclaimer, the term of this patent is extended or adjusted under 35 U.S.C. 154(b) by 206 days.

(21) Appl. No.: 15/269,250

(22) Filed: Sep. 19, 2016

(65) Prior Publication Data
US 2018/0080571 A1    Mar. 22, 2018

(51) Int. Cl.
| H05K 7/20 | (2006.01) |
| F04D 25/14 | (2006.01) |
| F04D 29/60 | (2006.01) |
| F04D 25/16 | (2006.01) |

(52) U.S. Cl.
CPC ......... H05K 7/20145 (2013.01); F04D 25/14 (2013.01); F04D 25/166 (2013.01); F04D 29/601 (2013.01); H05K 7/2019 (2013.01)

(58) Field of Classification Search
CPC ............ H05K 7/20145; H05K 7/20172; F16K 15/147; F16K 15/035; F16K 27/003; F16K 3/06; F16K 3/03; F04D 25/14; Y10T 137/7885; Y10T 137/784; Y10T 137/7843; F28F 27/00; F28F 27/02; F28F 27/003
See application file for complete search history.

(56) References Cited

U.S. PATENT DOCUMENTS

| 3,354,903 A | 11/1967 | Caruso |
| 3,905,787 A * | 9/1975 | Roth .................. B01D 46/0089 |
| | | 55/488 |
| 4,991,745 A | 2/1991 | Brown |
| (Continued) | | |

OTHER PUBLICATIONS

Russell, Daniel A., "The Dynamic Vibration Absorber", Graduate Program in Acoustics, The Pennsylvania State University, 2004-2011 (the year of publication is sufficiently earlier than the effective U.S. filing date and any foreign priority date so that the particular month of publication is not in issue), University Park, Pennsylvania.

*Primary Examiner* — Reinaldo Sanchez-Medina
*Assistant Examiner* — Nicole Gardner
(74) *Attorney, Agent, or Firm* — Jaffery Watson Mendonsa & Hamilton LLP (57) ABSTRACT

A cooling system for electrical and electronic devices for hot swapping of a fan module without affecting cooling efficiency due to air backflow, preventing stalling of newly installed exhaust device due to reverse rotation. A check valve assembly having an inlet side frame member, an outlet side frame member, and one or more non-symmetrical valve flaps, each flap having a movable part and a fixed part. The outlet side frame allows the flaps to open under suction pressure on side of the outlet side frame, the inlet side frame disallows the flaps to open under suction pressure on side of the inlet side frame, allowing air to flow in one direction from inlet side frame side to outlet side frame side only. The check valve assembly can be independent of the exhaust device. The check valve assembly can prevent backflow of air during hot swapping of the exhaust device.

10 Claims, 9 Drawing Sheets

(56) References Cited

U.S. PATENT DOCUMENTS

| | | | |
|---|---|---|---|
| 5,097,865 A | | 3/1992 | Riley |
| 5,890,959 A | | 4/1999 | Pettit et al. |
| 6,031,717 A | * | 2/2000 | Baddour .................. G06F 1/20 |
| | | | 361/679.48 |
| 6,035,896 A | * | 3/2000 | Liardet ............... A61M 16/208 |
| | | | 137/512.4 |
| 6,135,875 A | * | 10/2000 | French ................... H02B 1/565 |
| | | | 361/695 |
| 6,174,232 B1 | | 1/2001 | Stoll et al. |
| 6,554,698 B2 | | 4/2003 | Kranzdorf |
| 6,705,833 B2 | | 3/2004 | Tam et al. |
| 6,837,785 B2 | | 1/2005 | Soderland |
| 7,025,086 B2 | | 4/2006 | Maeda et al. |
| 7,128,526 B2 | | 10/2006 | Paulsen |
| 7,302,967 B2 | | 12/2007 | Maeda |
| 7,488,152 B2 | | 2/2009 | Liang |
| 8,057,161 B2 | | 11/2011 | Seidler |
| 8,205,640 B2 | | 6/2012 | Kawamura |
| 8,616,944 B2 | | 12/2013 | Chambo et al. |
| 8,668,435 B2 | | 3/2014 | Weisser et al. |
| 9,388,825 B1 | | 7/2016 | Behbehani |
| 9,938,990 B2 | | 4/2018 | Amin-Shahidi |
| 2006/0016482 A1 | | 1/2006 | Berens et al. |
| 2008/0310103 A1 | | 12/2008 | Della Fiora et al. |
| 2010/0025017 A1 | | 2/2010 | Zhang et al. |
| 2012/0063886 A1 | | 3/2012 | Tsai |
| 2012/0190289 A1 | * | 7/2012 | Wei .................... F04D 25/0613 |
| | | | 454/251 |
| 2013/0272868 A1 | | 10/2013 | Sun |
| 2015/0136141 A1 | | 5/2015 | Mittelstadt |
| 2015/0335852 A1 | | 11/2015 | Miller |
| 2016/0001104 A1 | | 1/2016 | Lewin |
| 2016/0327062 A1 | * | 11/2016 | Amin-Shahidi ...... F04D 29/646 |
| 2017/0218978 A1 | | 8/2017 | Amin-Shahidi |
| 2018/0080571 A1 | | 3/2018 | Yu et al. |

\* cited by examiner

CHECK VALVE FOR PREVENTING AIR BACKFLOW IN A MODULAR COOLING SYSTEM

COPYRIGHT NOTICE

Contained herein is material that is subject to copyright protection. The copyright owner has no objection to the facsimile reproduction of the patent disclosure by any person as it appears in the Patent and Trademark Office patent files or records, but otherwise reserves all rights to the copyright whatsoever. Copyright© 2016, Fortinet, Inc.

BACKGROUND

Field

The present subject matter generally relates to modular fans. In particular, the present subject matter relates to systems and methods for check valve structure that may prevent air backflow in a modular or swappable cooling system.

Description of the Related Art

Cooling fans are commonly used in closed electrical or electronic devices to help their continuous operation without worrying for excess heat generated due to their prolonged usage. This is because the heat generated by such devices is simultaneously exhausted by the cooling fans. Any disruption in working of the cooling fans, therefore, would require shutting down of the device. As such, easy fan maintenance has become an essential feature of the modern cooling designs.

Modular fan systems have become conventional, such systems also referred to sometimes as swappable, in that they allow for the swapping of the fans very easily and conveniently should any of the fans malfunction. One can easily remove a malfunctioning fan and replace it by a working fan without switching off the device. The process of replacing a modular fan in a switched-on device is called fan hot-swap.

Figure 1:
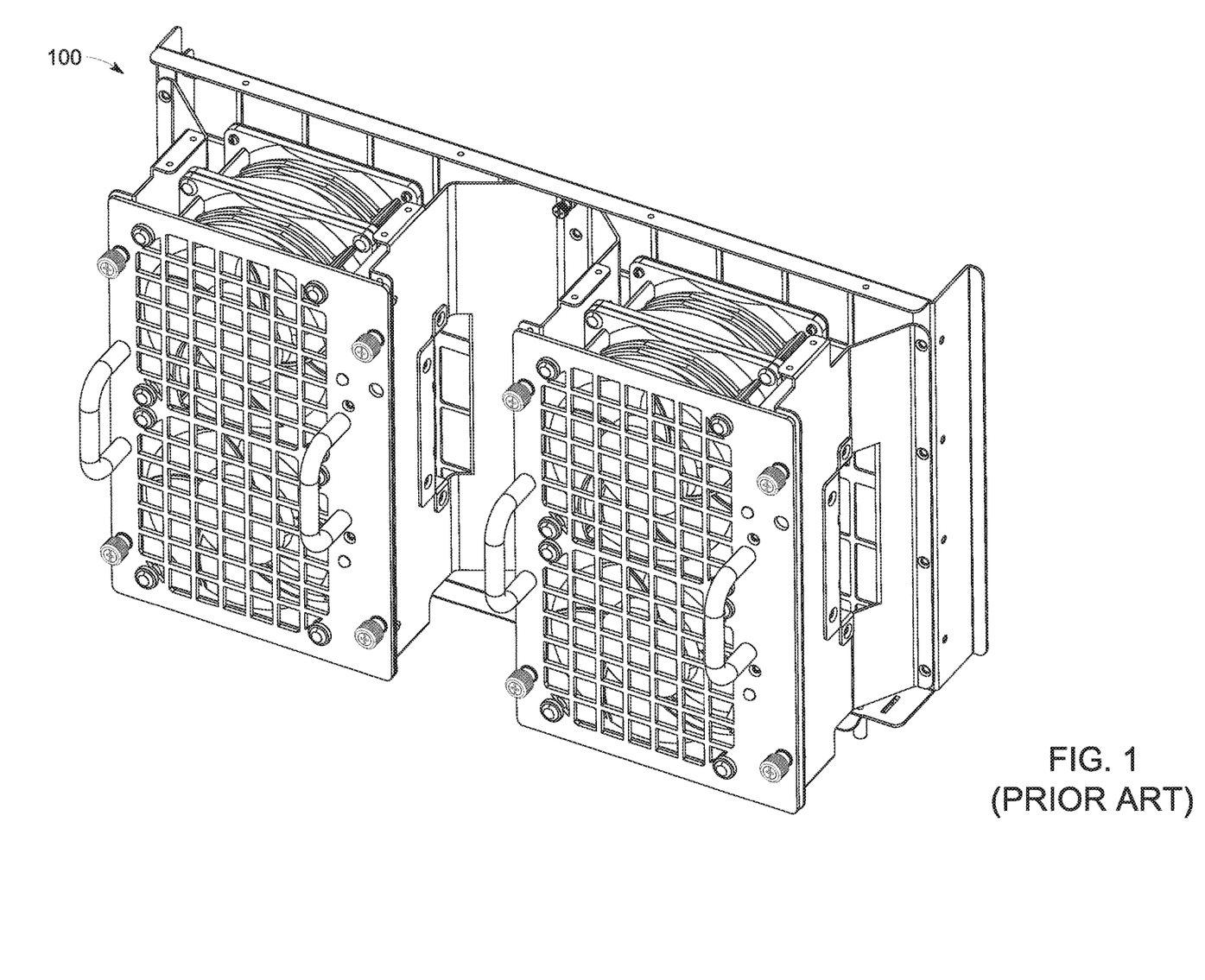
FIG. 1 illustrates a typical modular fan system for cooling closed electrical or electronic devices.
Figure 2:
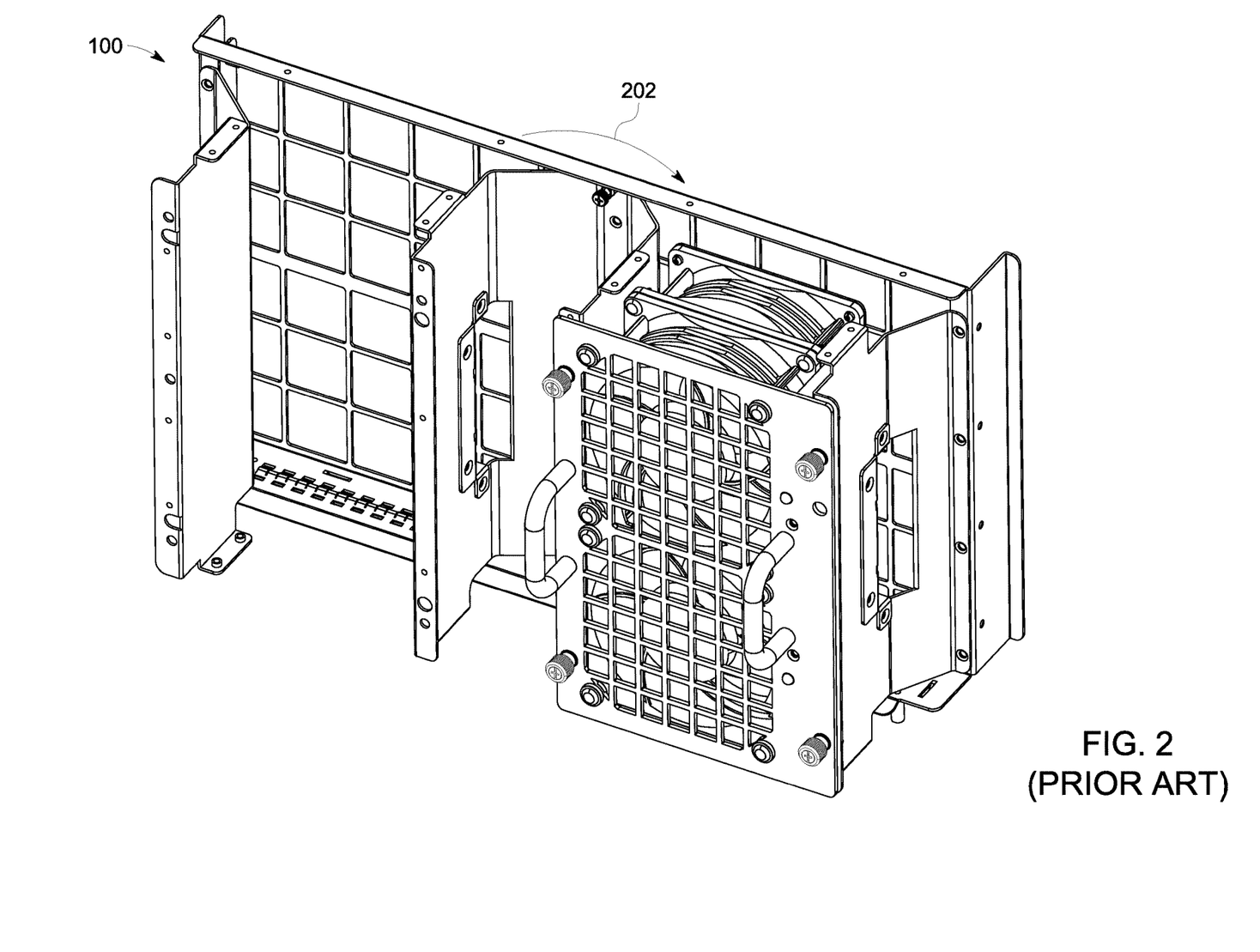
FIG. 2 illustrates a typical situation during hot fan swapping leading to air backflow.

During fan hot-swap in a multiple cooling fan system (as shown generally by reference element 100 for example in FIGS. 1 and 2), an air backflow is likely to occur at the swapping fan location (as shown in FIG. 2 by air backflow 202). Besides affecting cooling efficiency of the functioning fans, air backflow can also cause newly installed fan to rotate in a reverse direction, which may result in the fan being stalled and not able to start properly.

Typical air backflow prevention systems used with cooling systems incorporate rotatable vanes that remain in closed position under gravity to prevent backflow and open under flow of air. These systems besides being space inefficient, i.e., consume valuable space, have low efficiency as vanes are formed of a heavy plate material and resist airflow. Furthermore, these designs may not function properly when the exhaust flow has to turn at an angle relative to the axial flow in closed devices.

The United States Patent application number 2006/0016482 A1, discloses a check valve for an exhaust device formed from a thin flexible plate and attached to the exhaust side of the exhaust device to prevent air backflow in a cooling system. The disclosed architecture of '482 cannot prevent the air backflow during fan hot-swap and therefore may lead to drop in cooling efficiency and difficulty in starting the newly installed fan during hot swapping.

There is therefore a need for a fan hot-swap architecture that is space efficient, prevents air backflow under any condition and can be compatible with any cooling systems.

All publications herein are incorporated by reference to the same extent as if each individual publication or patent application were specifically and individually indicated to be incorporated by reference. Where a definition or use of a term in an incorporated reference is inconsistent or contrary to the definition of that term provided herein, the definition of that term provided herein applies and the definition of that term in the reference does not apply.

In some embodiments, the numbers expressing quantities of ingredients, properties such as concentration, reaction conditions, and so forth, used to describe and claim certain embodiments of the invention are to be understood as being modified in some instances by the term "about." Accordingly, in some embodiments, the numerical parameters set forth in the written description and attached claims are approximations that can vary depending upon the desired properties sought to be obtained by a particular embodiment. In some embodiments, the numerical parameters should be construed in light of the number of reported significant digits and by applying ordinary rounding techniques. Notwithstanding that the numerical ranges and parameters setting forth the broad scope of some embodiments of the invention are approximations, the numerical values set forth in the specific examples are reported as precisely as practicable. The numerical values presented in some embodiments of the invention may contain certain errors necessarily resulting from the standard deviation found in their respective testing measurements.

As used in the description herein and throughout the claims that follow, the meaning of "a," "an," and "the" includes plural reference unless the context clearly dictates otherwise. Also, as used in the description herein, the meaning of "in" includes "in" and "on" unless the context clearly dictates otherwise.

The recitation of ranges of values herein is merely intended to serve as a shorthand method of referring individually to each separate value falling within the range. Unless otherwise indicated herein, each individual value is incorporated into the specification as if it were individually recited herein. All methods described herein can be performed in any suitable order unless otherwise indicated herein or otherwise clearly contradicted by context. The use of any and all examples, or exemplary language (e.g. "such as") provided with respect to certain embodiments herein is intended merely to better illuminate the invention and does not pose a limitation on the scope of the invention otherwise claimed. No language in the specification should be construed as indicating any non-claimed element essential to the practice of the invention.

Groupings of alternative elements or embodiments of the invention disclosed herein are not to be construed as limitations. Each group member can be referred to and claimed individually or in any combination with other members of the group or other elements found herein. One or more members of a group can be included in, or deleted from, a group for reasons of convenience and/or patentability. When any such inclusion or deletion occurs, the specification is herein deemed to contain the group as modified thus fulfilling the written description of all Markush groups used in the appended claims.

SUMMARY

Aspects of the present disclosure relate to a cooling system for electrical and electronic devices. In particular, the present disclosure pertains to a cooling system that enables hot swapping of an exhaust device such as a fan module, without affecting cooling efficiency due to air backflow, and prevents stalling of newly installed exhaust device due to reverse rotation.

In an aspect, the disclosure provides a check valve assembly that can allow air to flow in one direction but blocks flow of air in other direction. In another aspect, the disclosed check valve assembly can be independent of the exhaust device. Thus, the disclosed check valve assembly, when installed appropriately, can prevent backflow of air during hot swapping of the exhaust device.

In an aspect, the check valve assembly can be located at the inlet side of the exhaust device and separate from the exhaust devices, for example fan modules, which can prevent air backflow effectively and efficiently in all conditions. In such architecture, the air backflow is prevented even during fan hot-swap since the independent check valve assembly is located at inlet side and remains there even when a fan module is removed from the cooling system. As a result, after a new fan is installed, the fan would not suffer from any air backflow and hence would not rotate in a reverse direction, i.e., the new fan module will start properly, as desired.

In an aspect, the disclosed check valve assembly can include a valve frame including an inlet side frame member and an outlet side frame member. The inlet side frame member can have one or a plurality of through inlet openings, and likewise, the outlet side frame member can have one or a plurality of through outlet openings. The check valve assembly can further include one or a plurality of valve flaps (also referred to as valves or flaps and all these terms being used interchangeably hereinafter), each flap having a movable part and a fixed part. Each of the flaps can be positioned such that its fixed part is fixed by either or a combination of the inlet side frame member and the outlet side frame member. In some implementations, this may be by having the one or more flaps being placed between the inlet and outlet frame members, wherein the movable part of each flap can deflect in the pre-selected direction to create an opening when subjected to pressure and thereby allow air flow through the opening.

In an aspect, the inlet openings of the inlet side frame member can be disposed relative to the flap so that each inlet opening provides structure to disallow deflection of the flap toward the inlet side of the frame, and the outlet openings of the outlet side frame member can be disposed relative to the flap so that each outlet opening provides an opening in its relative structure to allow deflection of the flap toward that outlet opening of the outlet side frame member. Thus when air flow from the outlet side tends to deflect and open the valve flap towards the inlet side its deflection is prevented by structure of the inlet side frame member; and on the other hand when air flow from the inlet side tends to deflect and open the valve flap towards the outlet side its deflection is not prevented by structure of the outlet side frame member thereby allowing the flap to deflect, creating an opening for air flow to take place. As can be appreciated, the inlet openings of the inlet side frame member can be smaller than the outlet openings of the outlet side frame member for the above functioning.

In an aspect, the valves and/or each respective flap of the valves can be non-symmetrical in shape such that the fixed part of a valve flap is defined as the broadest or widest part of the valve flap and the width of the movable part of the valve flap also reduces in proportion to the distance from the fixed part. Reducing width of the movable part results in a shorter deflectable flap side and a relatively longer deflectable flap side. The disclosed non-symmetrical shape of the valve and/or valve flap can result in shorter side of a valve flap to be deflected first. Thus the non-symmetrical shape may achieve a control for controlling the valve opening.

In an exemplary implementation, a non-symmetrical valve can be triangularly shaped with one side forming a fixed part and tapering part between other two sides forming tapering movable part. Four such triangular valves can be positioned adjacent to each other with their each respective apex placed together pointing inwardly toward each other to form a rectangle defined by the four fixed sides of each flap. This arrangement of non-symmetrical valve flaps and their controlled opening, the shorter sides tend to open more quickly than the longer sides, and thereby can form a controlled wind tunnel shape for better air flow and less turbulence; and can provide a better performance compared to a rather more symmetrically shaped valve where it is hard to predict the valve opening and as a result the airflow is often turbulent.

In an aspect, the plurality of valves flaps can be formed of a thin film and material of the thin film can be such that the flaps can automatically remain closed with material's internal spring force, after force of the air flow that tends to deflect them to open ceases to exist when there is no airflow. As can be seen, the disclosed arrangement of valves provides a better, more efficient and orientation proof mechanism compared to conventional solutions that rely on gravity to pull back the valve to closed position making them suitable for installation only in one orientation.

In an exemplary embodiment, the disclosed structure of the valve flaps can be implemented in a thin film such as check valve film of suitable material, wherein the check valve film can incorporate plurality of substantially repeated rectangular shaped pattern that can be by asymmetrically defined. The square shaped pattern can incorporate an aperture/slot in centre, and four cut slots that can extend from the aperture/slot towards four corners of the square shaped pattern along diagonals of the square such that four triangle shaped flaps are formed in each of the square shaped pattern. The four triangle shaped flaps can deflect along four sides of the square shaped pattern to create an opening in the check valve film to allow air to pass through. In another aspect, when the flaps are not deflected, they do not allow air to pass through the check valve film.

In an aspect, the check valve film can be sandwiched between the inlet side frame member and the outlet side frame member; and the outlet openings of the outlet side frame member can be square shaped grid matching the size of the square shaped pattern in the check valve film. Further, the square shaped pattern and the square shaped grid of the outlet side frame member can be disposed relative to each other such that the deflection of the four triangle shaped flaps in each of the square shaped pattern towards the outlet side frame member is unhindered. Likewise, the inlet openings on the inlet side frame member can also be square shaped grid. However, they can be smaller in size compared to square shaped pattern in the check valve film and can be disposed relative to the square shaped pattern such that the deflection of the four triangle shaped flaps in each of the square shaped pattern towards the inlet side frame member is disallowed.

In an aspect, the present disclosure also provides a method for blocking backflow of air from outside to an enclosure of an electronic or electrical device during swapping of its exhaust device such as cooling fans configured as exhaust fans. The disclosed method can include steps of (a) providing one or more valve flaps that can deflect and deflection of the valve flaps creates openings for air to pass through; wherein the valve flaps can be non-symmetrically in shape to enable their controlled deflection; (b) deflecting the one or more valve flaps such that the deflection of the valve flaps is towards the inlet side of the cooling device and their deflection outward away from the inlet side of the cooling device is disallowed. In the disclosed method, the valve flaps can be positioned on the inlet side of the cooling fans and they can remain in position along with controls for their deflection when the cooling fan is removed for swapping in which case inability of the valve flaps to deflect towards inlet side i.e. towards inside of the enclosure can stop flow of air from outside to inside of the enclosure, thereby enabling hot swapping of the cooling fans.

In an aspect of the disclosed method, the valve flaps can be formed of a thin film such that deflection of the valve flaps creates openings in the thin film for air to pass through and the flaps in their un-deflected position do not allow air to pass through the thin film.

Various objects, features, aspects and advantages of the inventive subject matter will become more apparent from the following detailed description of preferred embodiments, along with the accompanying drawing figures in which like numerals represent like components

BRIEF DESCRIPTION OF THE DRAWINGS

The accompanying drawings are included to provide a further understanding of the present disclosure, and are incorporated in and constitute a part of this specification. The drawings illustrate exemplary embodiments of the present disclosure and, together with the description, serve to explain the principles of the present disclosure.

In the Figures, similar components and/or features may have the same reference label. Further, various components of the same type may be distinguished by following the reference label with a second label that distinguishes among the similar components. If only the first reference label is used in the specification, the description is applicable to any one of the similar components having the same first reference label irrespective of the second reference label.

DETAILED DESCRIPTION

Devices, systems and methods are described for check valves that prevent air backflow in modular cooling systems. The following is a detailed description of implementations of the disclosure depicted in the accompanying drawings. The implementations are in such detail as to clearly communicate the disclosure. However, the amount of detail offered is not intended to limit the anticipated variations of implementations; on the contrary, the intention is to cover all modifications, equivalents, and alternatives falling within the spirit and scope of the present disclosure as defined by the appended claims.

Each of the appended claims defines a separate invention, which for infringement purposes is recognized as including equivalents to the various elements or limitations specified in the claims. Depending on the context, all references herein to the "invention" may in some cases refer to certain specific implementations only. In other cases it will be recognized that references to the "invention" will refer to subject matter recited in one or more, but not necessarily all, of the claims. To the extent a term used in a claim is not defined below, it should be given the broadest definition persons in the pertinent art have given or would give that term as reflected in printed publications and issued patents at the time of filing.

Implementations described herein relate to devices, systems and methods for check valve structure to prevent air backflow in modular cooling systems. In particular, the disclosed devices, systems and methods can be used in cooling systems for electrical and electronic devices so that hot swapping of an exhaust device such as a fan can be done without affecting cooling efficiency due to air backflow, and without stalling of existing or newly installed exhaust devices due to reverse rotation.

The disclosed check valve assembly can allow air to flow in one direction but blocks flow of air in other direction, and can be installed independent of the exhaust device on its inlet side so that the exhaust device can be removed for hot swapping without affecting its functioning i.e. blocking backflow of air.

In an aspect, the disclosed check valve assembly can include a valve frame having an inlet side frame member and an outlet side frame member. The inlet side frame member can have one or a plurality of through inlet openings, and, likewise the outlet side frame member can have one or a plurality of through outlet openings. The check valve assembly can further include one or a plurality of valve flaps, each flap having a movable part and a fixed part. Each of the flaps can be positioned such that its fixed part is fixed by either or a combination of the inlet side frame member and the outlet side frame member. In some implementations, this may be by having the one or more flaps being placed between the inlet and outlet frame members, wherein the movable part of each flap can deflect in the pre-selected direction to create an opening when subjected to pressure and thereby allow air flow through the opening.

In an aspect, the inlet openings of the inlet side frame member can be disposed relative to the flap so that each inlet opening provides structure to disallow deflection of the flap toward the inlet side of the frame, and the outlet openings of the outlet side frame member can be disposed relative to the flap so that each outlet opening provides an opening in its relative structure to allow deflection of the flap toward that outlet opening of the outlet side frame member. Thus, when air flow from the outlet side tends to deflect and open the valve flap towards the inlet side, its deflection is prevented by structure of the inlet side frame member; and on the other hand, when air flow from the inlet side tends to deflect and open the valve flap towards the outlet side, its deflection is not prevented by structure of the outlet side frame member thereby allowing the flap to deflect, creating an opening for air flow to take place. As can be appreciated, the inlet openings of the inlet side frame member can be smaller than the outlet openings of the outlet side frame member for the above functioning.

In an aspect, the valves and/or each respective flap of the valves can be non-symmetrical in shape such that the fixed part of a valve flap is defined as the broadest or widest part of the valve flap and the width of the movable part of the valve flap also reduces in proportion to the distance from the fixed part. Reducing width of the movable part results in a shorter deflectable flap side and a relatively longer deflectable flap side. The disclosed non-symmetrical shape of the valve and/or valve flap can result in shorter side of a valve flap to be deflected first. Thus the non-symmetrical shape may achieve a control for controlling the valve opening.

In an exemplar implementation, a non-symmetrical valve or valve flap can be triangularly shaped. Moreover, one or more of these can be formed on a check valve film that itself may be sandwiched between an inlet side frame member and an outlet side frame member. Triangularly shaped non-symmetrical valves or valve flaps can be formed in a check valve film by means of slots defined in and through the valve film. Material of check valve film hereof can be such that the flaps can automatically and/or resiliently remain closed with material's internal spring force, before and after a force of air flow that tends to deflect them to open ceases to exist when there is no airflow. As can be seen, an arrangement of valves as disclosed herein may provide a better, more efficient and orientation proof mechanism compared to conventional solutions that rely on gravity or other forces to pull back a valve closure member to a closed position; an issue that often makes such other prior valves suitable for installation only in one orientation.

Triangular shaped valves or valve flaps according hereto can have a relatively broad fixed side and at least two non-equal sides. The area between the two non-equal sides forms a tapering movable part. The broader third side of the triangle can form the fixed part. In some implementations, four such triangular valves can be positioned adjacent each other with each respective apex placed together pointing inwardly toward each other to form a rectangle defined by the four broader fixed sides of each triangle. These four broader fixed sides also function as the fixed part of four valve flaps. In many implementations, the respective non-equal flap sides include one each of a shorter and a corresponding longer side; and many such implementations have the respective long side of a flap disposed adjacent the shorter flap side of the next adjacent flap. In so disposing such flaps, a substantially central, typically relative small opening is formed in the center of the rectangle formed by four adjacent flaps. This arrangement of non-symmetrical valve flaps and their controlled opening, the shorter sides tend to open more quickly than the longer sides, and thereby can form a controlled wind tunnel shape for better air flow and less turbulence; and can provide a better performance compared to a rather more symmetrically shaped valve where it is hard to predict the valve opening and as a result the airflow is often turbulent.

In an aspect, the present disclosure also provides a method for blocking backflow of air from outside to an enclosure of an electronic or electrical device during swapping of an exhaust device such as cooling fans configured as exhaust fans. The disclosed method can include the steps of (a) providing on the inlet side of the cooling device one or more valve flaps that can deflect and deflection of the valve flaps creates openings for air to pass through; wherein the valve flaps can be non-symmetrically defined in shape to enable their controlled deflection; (b) deflecting the one or more valve flaps such that the deflection of the valve flaps is towards the inlet side of the cooling device and their deflection outward away from the inlet side of the cooling device is disallowed. In the disclosed method, the valve flaps can be positioned on the inlet side of the cooling fans and they can remain in position along with controls for their deflection when the cooling fan is removed for swapping in which case inability of the valve flaps to deflect towards inside of the enclosure can stop flow of air from outside to inside of the enclosure thereby enabling hot swapping of the cooling fans.

Figure 3:
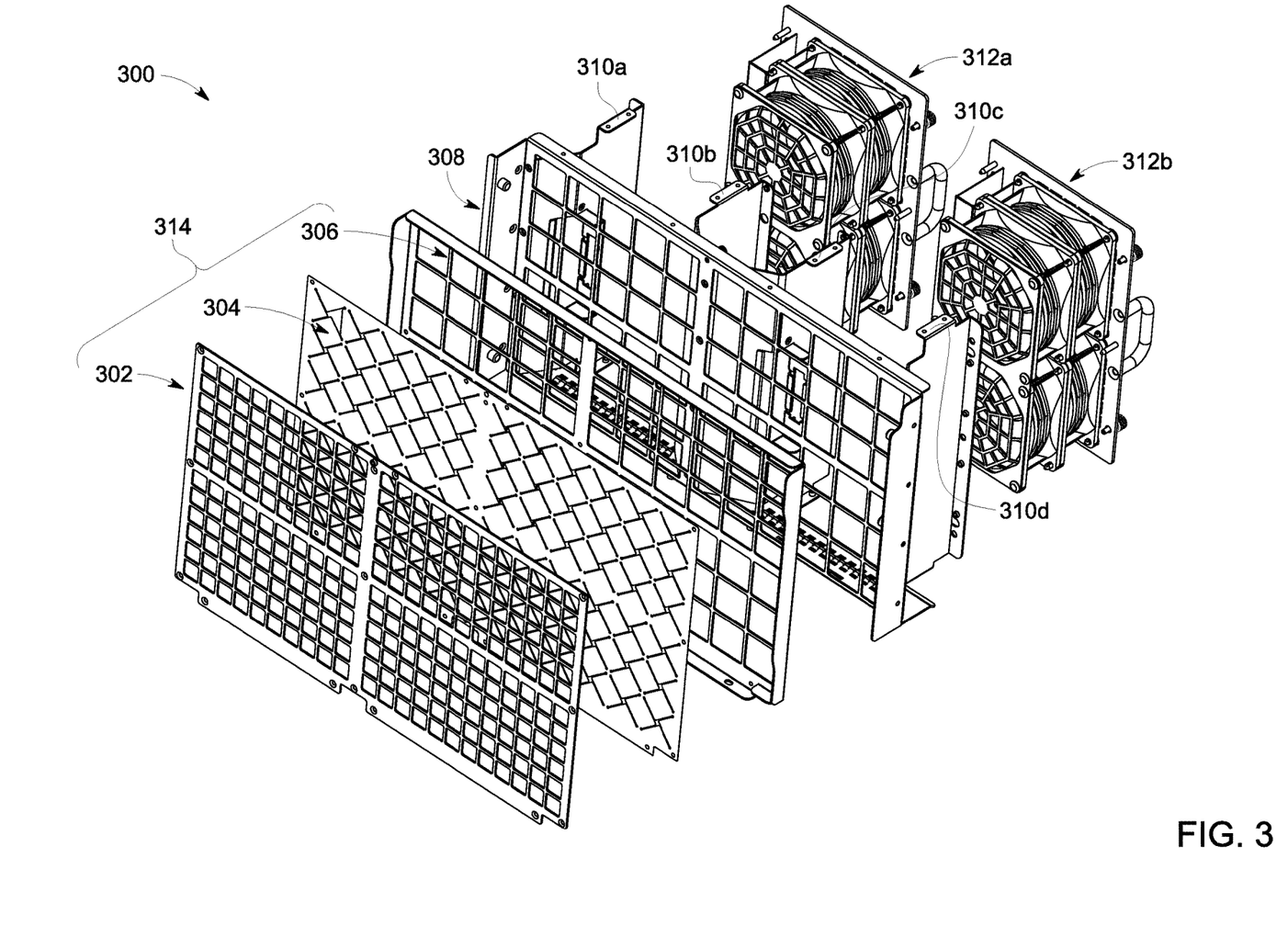
FIG. 3 illustrates an exemplary exploded view of a modular cooling system with check valve assembly in accordance with implementations hereof.

FIG. 3 illustrates an exploded view of a modular cooling system 300 that includes a check valve assembly 314 and exhaust fans 312*a* and 312*b*. The check valve assembly 314 can include an inlet side frame member 302, an outlet side frame member 306, and a check valve film 304. The inlet side frame member 302 and the outlet side frame member 306 together form a valve frame that, besides holding the plurality of valve flaps (shown, but not here separately identified, but, see FIG. 5 and accompanying text for detailed disclosure), also functions to control opening of the valve flaps in the pre-defined direction. For example, the valve frame 302/306 may be configured to allow the valve flaps to deflect when airflow from the inlet side (defined by inlet side fame member 302) exerts a force on the valve flaps, but disallows the valve flaps to deflect in the other direction when airflow from the outlet side (defined by outlet side frame 306) exerts a force on the valve flaps, or more appropriately when a negative pressure is applied by the cooling devices to suck open the flaps. Deflection of the valve flaps, when in the appropriate direction, creates an opening through which air can pass, and on the other hand, when the valve flaps are not deflected, and indeed prevented from deflecting in the inappropriate direction, air cannot flow through the valves. Thus, controlled deflection (or opening and the terms used interchangeably hereinafter) of the valves by the valve frame allows air flow from inlet frame side towards outlet frame side, but prevents airflow in the opposing direction from the outlet frame side to the inlet frame side.

In an implementation, one or a plurality of valve flaps can be formed on the check valve film 304. The check valve film 304 can be placed between the inlet side frame member 302 and the outlet side frame member 306 as shown in the exploded view of system 300. During assembly of a check valve assembly 314, the check valve film 304 can be sandwiched between the inlet side frame member 302 and the outlet side frame member 306 with the two members 302 and 306 holding the check valve film 304 between them.

In an implementation, the modular cooling system 300 can also include a check valve mounting plate 308 that can provide a structure upon which to mount the check valve assembly 314 as well as to which fan modules such as modules 312*a* and 312*b* can be attached. The fan modules 312*a*, 312*b* can be mounted on flanges such as 310*a, b, c, d*, and as is apparent, any of the fan modules 312*a*, 312*b* can be removed and fitted without disturbing the check valve assembly 314 that is fitted on other side of the check valve mounting plate 308.

Figure 4:
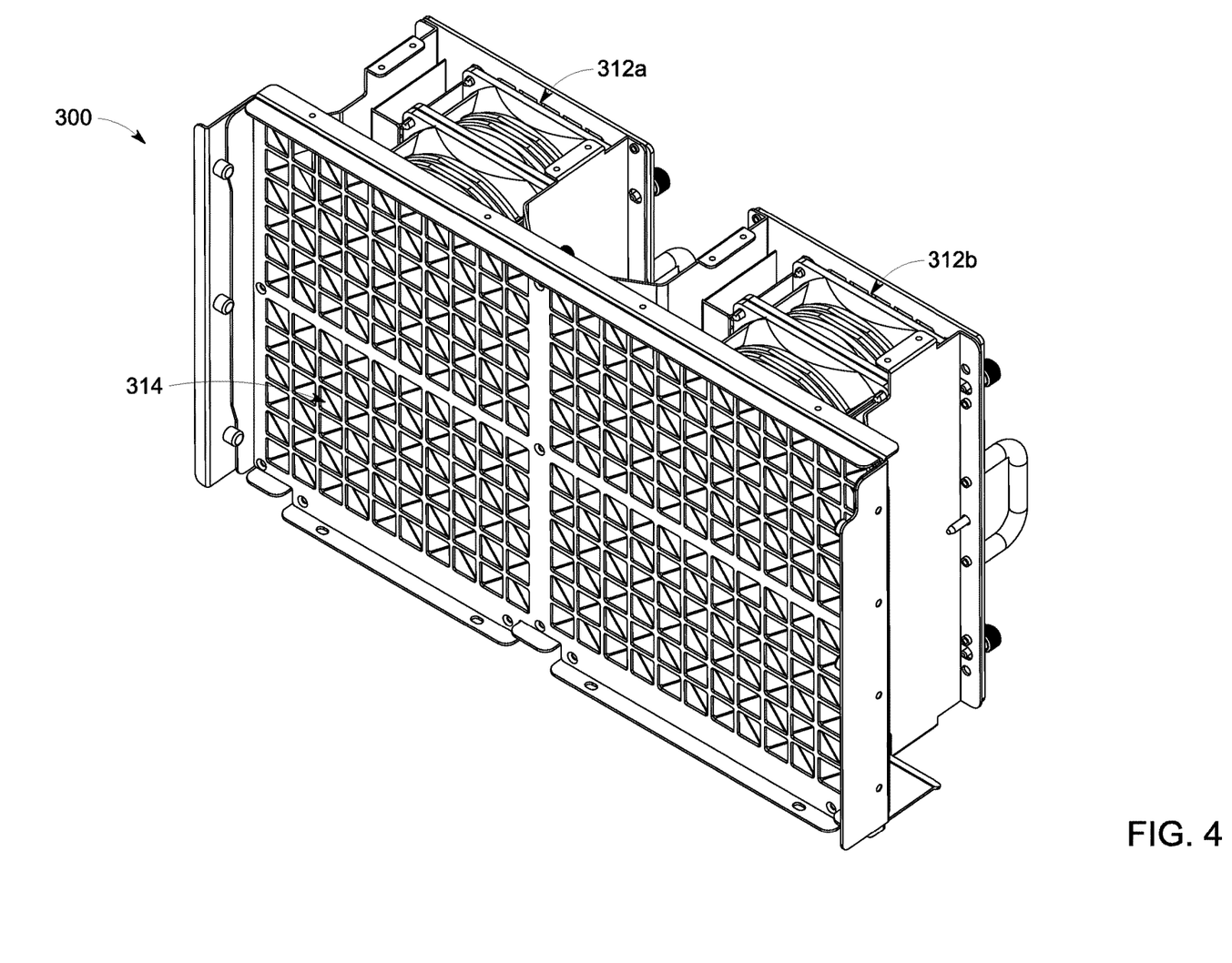
FIG. 4 illustrates an exemplary isometric view of a modular cooling system assembled incorporating check valve assembly in accordance with an implementation hereof.

FIG. 4 illustrates an exemplary perspective view of assembled modular cooling system 300 incorporating check valve film assembly 314 in accordance with an implementation hereof. As can be seen, disclosed modular cooling system 300 can include more than one cooling fan such as the shown fan modules 312*a* and 312*b*, and the fan modules 312*a*, 312*b* function as exhaust fans i.e. the inlet side of the cooling system faces the enclosure of the electrical or electronic device so as to suck warm air from within the enclosure and move the warm air out and away from the electronics. In many implementations, the check valve assembly 314 is fixed on the inlet side of the fan modules 312*a*, 312*b* such that when any one of the fan modules 312*a*, 312*b* is removed for swapping, the check valve assembly 314 remains unaffected.

In an implementation, the check valve assembly 314 can be oriented such that it allows air flow from inside the enclosure to be moved outside and away from the electronics but disallows airflow from outside the enclosure to the inside of the enclosure. Thus, when any one of the fan modules 312*a*, 312*b* is removed for replacement, suction created by other functional fan module 312*a*, 312*b* does not cause air flow from outside to the inside the enclosure.

Figure 5:
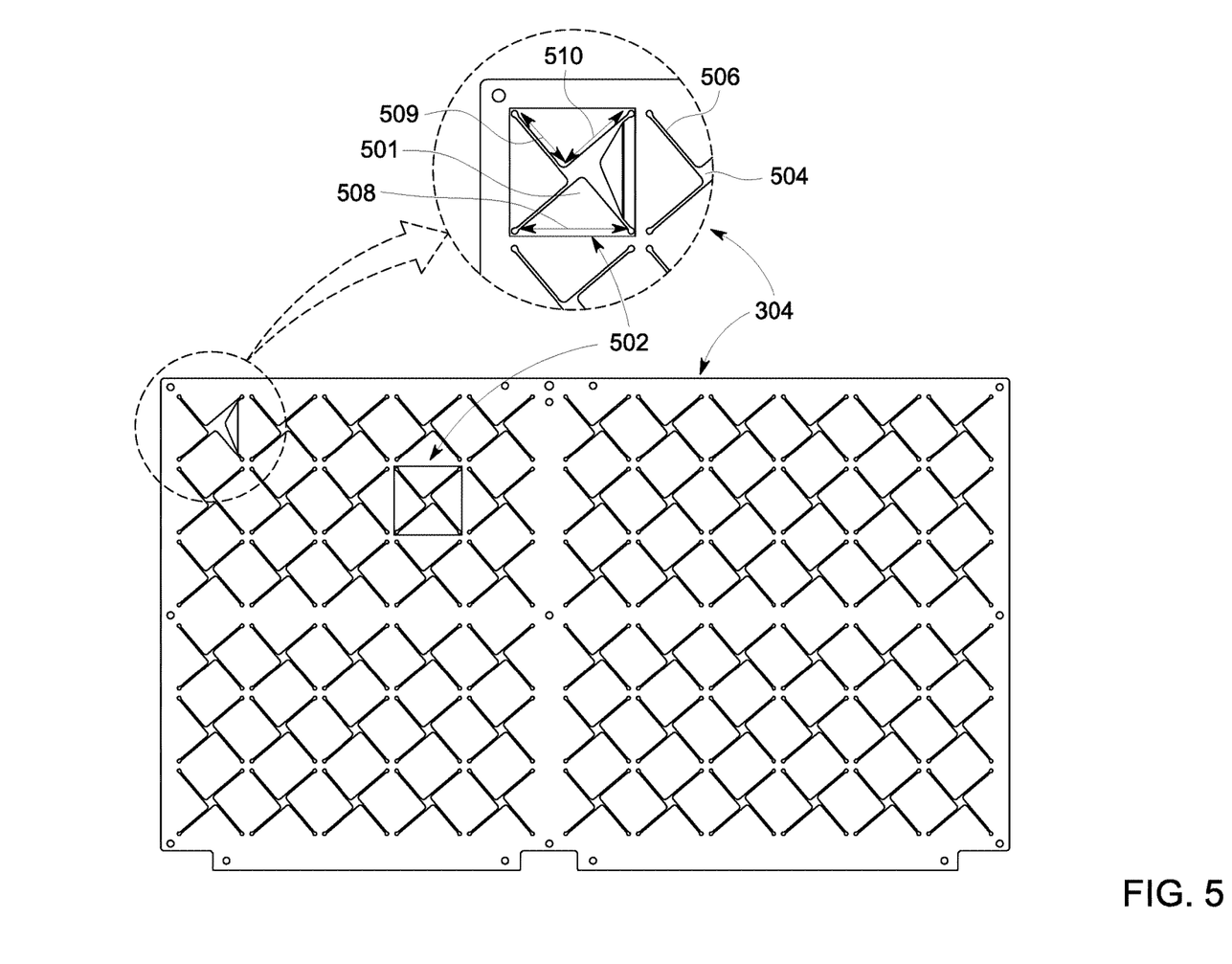
FIG. 5 illustrates an exemplary view of a check valve film with film pattern in accordance with an implementation hereof.

FIG. 5 illustrates an exemplary view of a check valve film 304 with a film pattern in accordance with an implementation hereof. In an exemplary implementation, the disclosed structure of the valve flaps 501 can be implemented in the check valve film 304 of suitable material. The check valve film 304 can incorporate a plurality of substantially repeated rectangular shaped patterns such as 502 that can be asymmetrically defined. The square shaped pattern 502 can incorporate an aperture/slot 504 in the center, and four cut slots 506 that can extend from the aperture/slot 504 towards four corners of the square shaped pattern 502 along diagonals of the square such that four triangle shaped flaps 501 are formed in each of the square shaped pattern. The four triangle shaped flaps 501 can deflect as shown in the enlarged view, along and as defined by the respective four fixed sides 508 of the four flaps 501 to create an opening in the check valve film 304 to allow air to pass through. In another aspect, when the flaps 501 are not deflected, they do not allow air to pass through the check valve film 304.

In an aspect, the asymmetric definition used herein may typically include a shorter deflectable flap side 509 and a relatively longer deflectable flap side 510 of each triangular shaped valve flap 501. The shorter deflectable flap side 509 is more quickly susceptible to change in pressure and begins to deflect before the longer deflectable side 510. This provides for a more uniform opening of each flap and consequent more laminar, less turbulent flow of air through the aperture defined thereby.

As can be seen, the above disclosed architecture of valve flaps 501 in the check valve film 304 provides non-regularly defined triangularly shaped valve flaps 501 that are non-symmetrical such that their fixed part is broader/wider and one side of the deflectable portion is longer than the other. As shown in the enlarged view in FIG. 5, the non-symmetrical shape of the valve 501 can result in shorter side 509 of the valve 501 to be deflected first. Thus, the non-symmetrical shape works as a controlled valve opening mechanism.

Further, architecture of an aperture 504 in the center and four cut slots 506 extending from the aperture 504 towards corners of the square shaped pattern 502 results in four triangular valve flaps 501 that are positioned next to each other with their respective apices placed together, pointed toward each other. Thus, when the shorter sides 509 of the four valve flaps 501 move under pressure of air flow, they together form a controlled wind tunnel shape for better air flow and less turbulence. The controlled wind tunnel shape can provide a better performance compared to a typical symmetrical shaped valve where it is hard to predict the valve opening and the airflow is often turbulent.

In an embodiment, material of the check valve film 304 can be resilient such that the flaps 501 can automatically remain and return to closed position by the material's internal resilient spring force, after force of the air flow that tends to deflect them to open ceases to exist when there is no airflow. As can be seen, the disclosed arrangement of valves 501 provides a better, more efficient and orientation proof mechanism compared to conventional solutions that in some implementations rely on gravity to pull back the valve to closed position making them suitable for installation only in one orientation.

Figure 6:
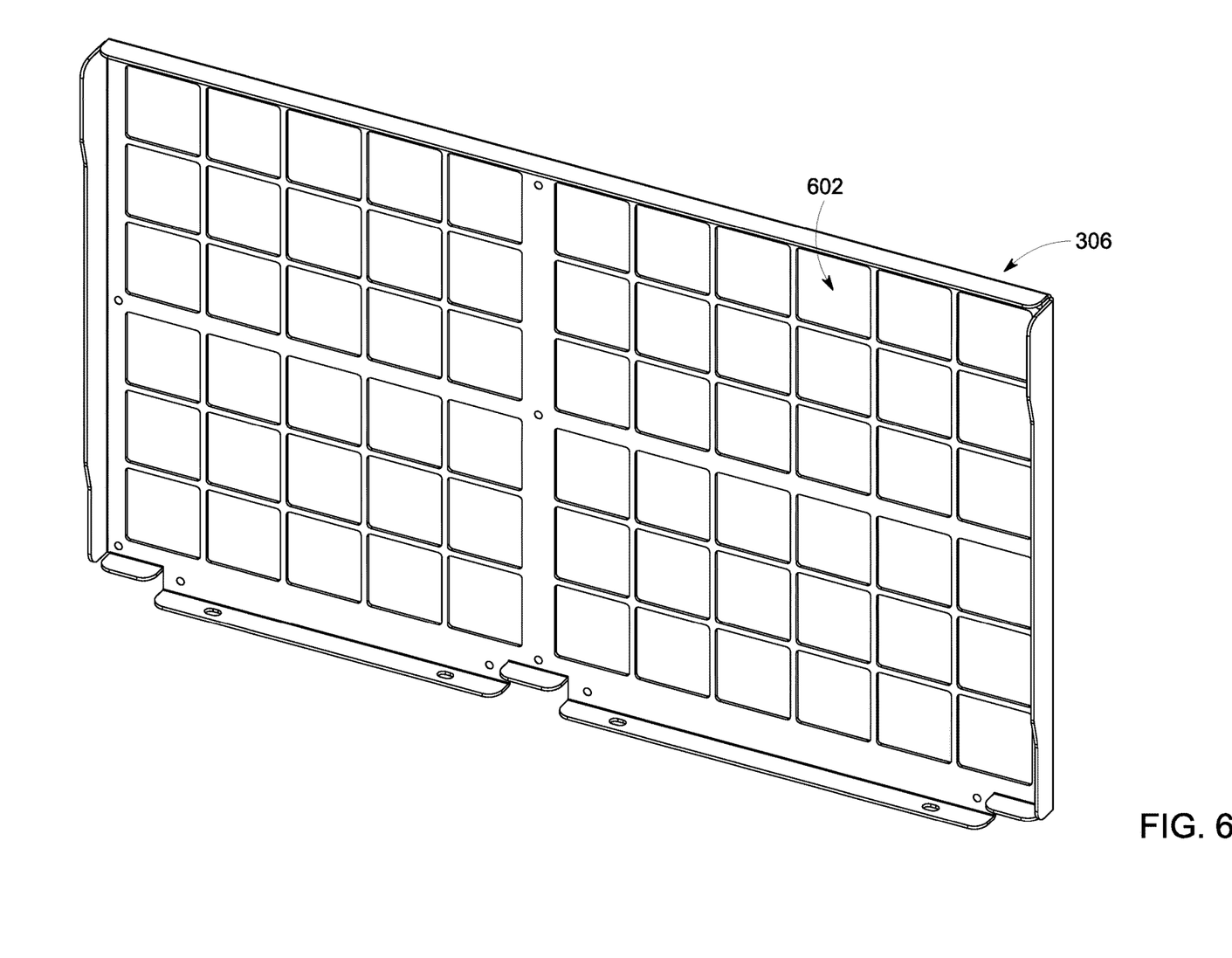
FIG. 6 illustrates an exemplary isometric view of an outlet side frame member in accordance with an implementation hereof.

FIG. 6 illustrates an exemplary isometric view of outlet side frame member 306 in accordance with an implementation hereof. The outlet side frame member 306 can incorporate a plurality of outlet openings 602 as shown in FIG. 6. The outlet openings 602 in the outlet side frame member 306 can be a square shaped grid corresponding in size relative to that of the square shaped pattern 502 (see FIG. 5) in the check valve film 304. Further, the square shaped pattern 502 of the check valve film 304 and the square shaped grid 602 of the outlet side frame member 306 can be disposed relative to each other such that the sides of the square shaped grid 602 can be disposed to provide support to the fixed part (sides 508 of FIG. 5) of the valve flaps 501 when the check valve film 304 is placed next to the outlet side frame member 306; and deflection of the four triangularly shaped flaps 501 in each of the square shaped pattern 502 towards the outlet side frame member 306 is unhindered. Thus, the structure of the outlet side frame member 306 allows the valve flaps 501 to deflect towards the outlet side frame member 306 when a negative pressure is applied by the cooling devices to suck open the flaps. Deflection of the valve flaps creates an opening through which air can pass.

Figure 7:
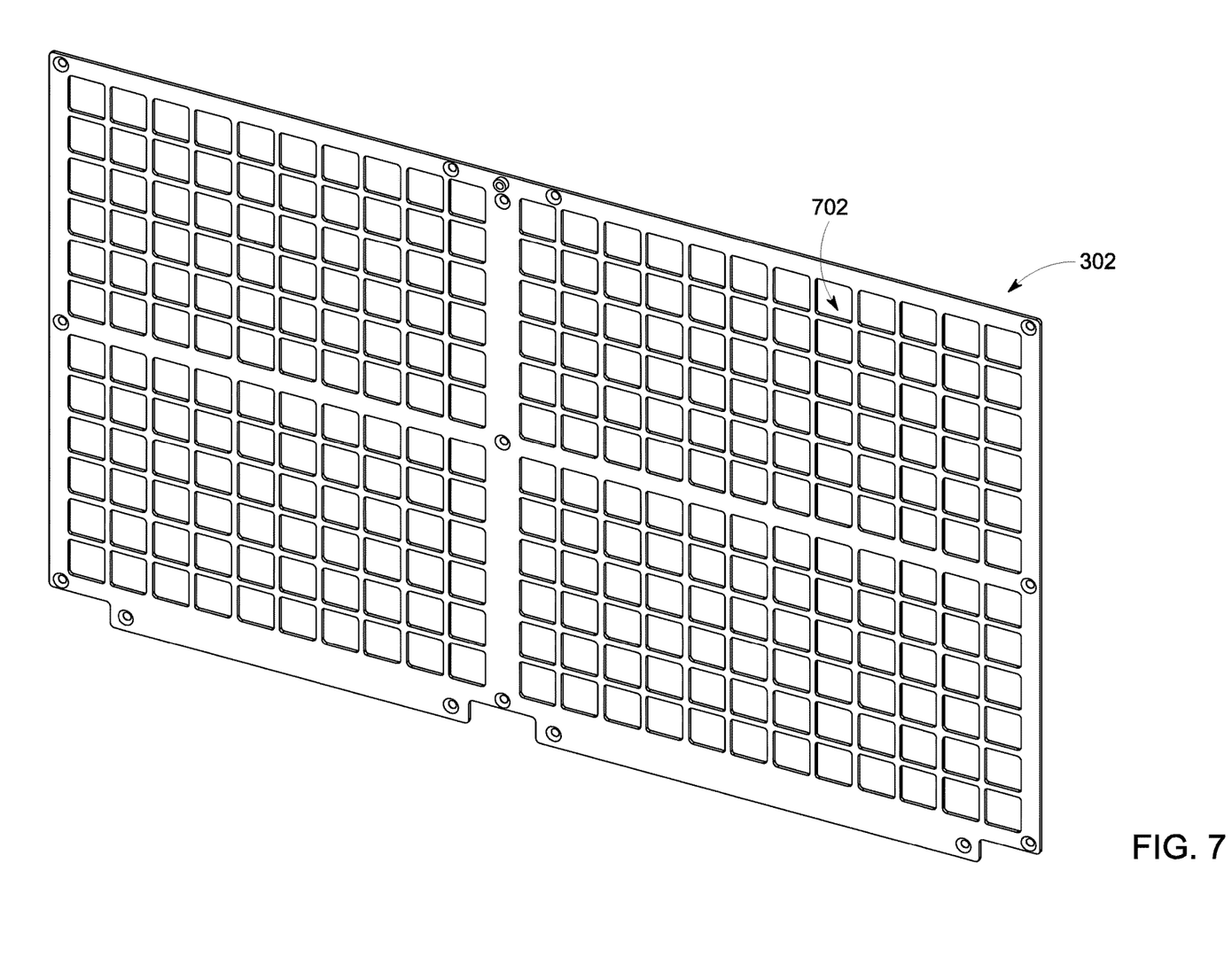
FIG. 7 illustrates an exemplary isometric view of an inlet side frame member in accordance with an implementation hereof.

FIG. 7 illustrates an exemplary isometric view of inlet side frame member 302 in accordance with an embodiment hereof. In an implementation, the inlet openings 702 on the inlet side frame member 302 can also be square shaped grid. However, they can and may preferably be smaller in size compared to square shaped pattern 502 in the check valve film 304 and the outlet side apertures 602 in outlet frame member 306, and can be disposed relative to the square shaped pattern 502 such that the deflection of the four triangle shaped flaps 501 in each of the square shaped pattern 502 towards the inlet side frame member 302 is disallowed. In an exemplary embodiment, the grid of inlet openings 702 in the inlet side frame member 302 can include a grid similar in size and disposed to match the grid of outlet holes 602 in the outlet side frame member 308 but further divided in number of smaller parts say in four parts corresponding to the four flaps 501 per each square 502. Thus, the grid of the inlet holes 702 and the grid of outlet holes 602, when placed on two sides of the check valve film 304, can hold the fixed part 508 of the valve flaps 501 in the check valve film 304. Further, the grid of smaller inlet side holes 702 in the inlet side frame member 302 disallows the valve flaps to deflect towards the inlet side frame member 302 under influence of a negative pressure that can be present on the side of inlet side frame member 302 due to operating fan module during hot swapping.

Figure 8:
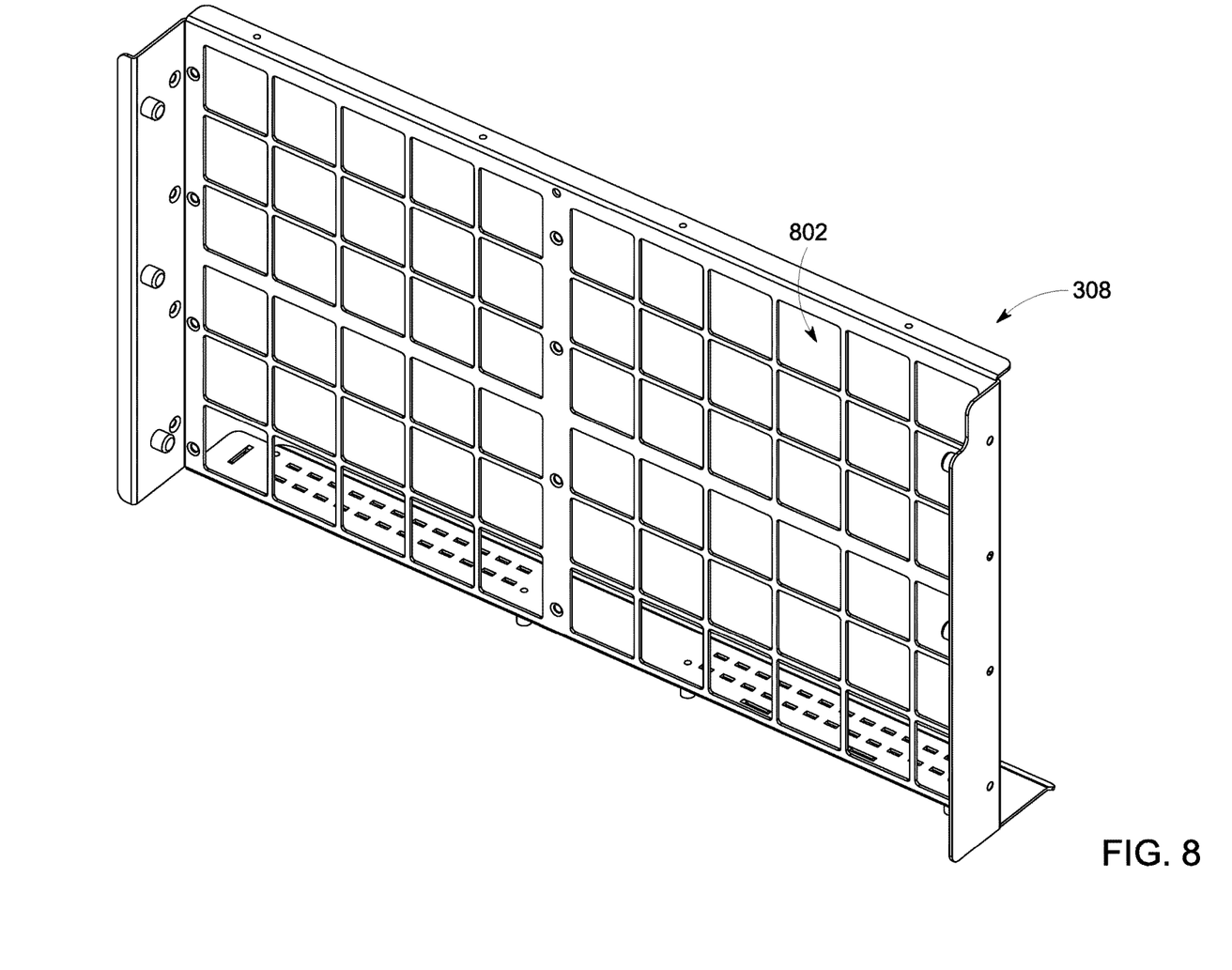
FIG. 8 illustrates an exemplary isometric view of a check valve mounting plate in accordance with an implementation hereof.

FIG. 8 illustrates an exemplary isometric view of check valve mounting plate 308 in accordance with an implementation hereof. The check valve mounting plate 308 can be configured to facilitate mounting of the check valve assembly 314 on one side and one or a plurality of fan modules on the other side such that when any one or more of the fan modules is removed for swapping, the check valve assembly 314 remains unaffected and continues to block air flow from outlet side to the inlet side. Thus, hot swapping of a fan module can be done without affecting cooling efficiency or stalling of newly installed exhaust device due to reverse rotation on account of air flow in reverse direction. The check valve mounting plate 308 may also incorporate square shaped grid 802 sized so as to allow unhindered deflection of the flaps 501 when the check valve assembly 314 is placed close to it on inlet side.

Figure 9:
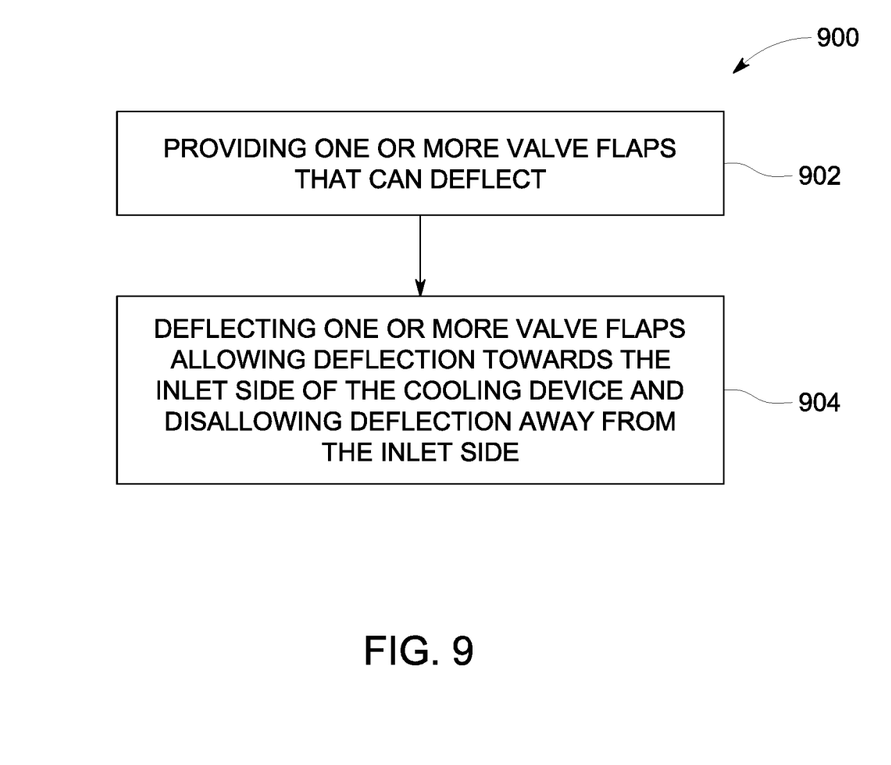
FIG. 9 illustrates an exemplary method flow diagram for method of blocking backflow of air from outside to an enclosure of an electronic or electrical device during hot swapping of its exhaust device in accordance with an implementation hereof.

In an aspect, the present disclosure also provides a method for blocking backflow of air from outside to an enclosure of an electronic or electrical device during hot swapping of its exhaust device such as cooling fans configured as exhaust fans. FIG. 9 illustrates an exemplary method flow diagram for method 900 for blocking backflow of air from outside to an enclosure of an electronic or electrical device during swapping of its exhaust device. The disclosed method 900 can at step 902 provide one or more valve flaps 501 that can deflect, where deflection of the valve flaps 501 creates openings for air to pass through, and where the valve flaps can be non-symmetric in shape to enable their controlled deflection; at step 904 the one or more valve flaps 501 can be deflected such that the deflection of the valve flaps is towards the inlet side of the cooling device and their deflection outward away from the inlet side of the cooling device is disallowed. In the disclosed method, the valve flaps 501 can be positioned on the inlet side of the cooling fans and they can remain in position along with controls for their deflection when the cooling fan is removed for swapping in which case inability of the valve flaps to deflect towards inlet side i.e. towards inside of the enclosure can stop flow of air from outside to inside of the enclosure thereby enabling hot swapping of the cooling fans.

While the foregoing describes various embodiments of the invention, other and further embodiments of the invention may be devised without departing from the basic scope thereof. The scope of the invention is determined by the claims that follow. The invention is not limited to the described embodiments, versions or examples, which are included to enable a person having ordinary skill in the art to make and use the invention when combined with information and knowledge available to the person having ordinary skill in the art.

What is claimed is:

1. A check valve assembly for a modular cooling system, the check valve assembly configured to substantially prevent back-flow; the check valve assembly comprising:
   a valve frame including:
      an inlet side frame member having a first framework of spaced structural elements, including a first set of structural elements that are parallel to each other and a second set of structural elements that are parallel to each other and orthogonal to the first set of structural elements of the first framework of spaced structural elements, defining a grid of inlet openings therethrough, and,
      an outlet side frame member having a second framework of spaced structural elements, including a first set of structural elements that are parallel to each other and a second set of structural elements that are parallel to each other and orthogonal to the firsts set of structural elements of the second framework of spaced structural elements, defining a grid of outlet openings therethrough; and,
   a check valve film patterned with a plurality of rows and columns of a repeated rectangular shaped pattern, each rectangular shape of the repeated rectangular shaped pattern including a plurality of non-symmetrical triangular valve flaps, each flap having a movable part and a fixed part, each flap being disposed fixed at its respective fixed part to one or the other or both and between the inlet side frame member and the outlet side frame member, wherein the second framework of spaced structural elements are aligned with the repeated rectangular shaped pattern to provide support to respective fixed parts of the plurality of non-symmetrical triangular valve flaps and avoid hindering of outward deflection of respective movable parts of the plurality of non-symmetrical triangular valve flaps, non-symmetrical being defined by each flap having a shorter free side and longer free side, the shorter free side being shorter than the longer free side;
   the movable part of each flap of the plurality of flaps of multiple rectangular shapes in multiple columns and multiple rows of the plurality of rows and columns of the repeated rectangular shaped pattern being disposed to open when subjected to pressure created by air flow generated by a single exhaust fan of the modular cooling system thereby creating multiple openings in the check valve film through which the air flow passes.

2. A check valve assembly according to claim 1:
   the inlet openings of the inlet side frame member being defined to be smaller than the outlet openings of the outlet side frame member.

3. A check valve assembly according to claim 1:
   the inlet openings of the inlet side frame member being configured to be disposed relative to each flap so that each inlet opening provides structure to disallow deflection of the flap toward an inlet side of the valve frame.

4. A check valve assembly of claim 1, each rectangular shape of the repeated rectangular shaped pattern further incorporating a slot in a centre of the rectangular shape, and four cut slots extending from the slot in the centre towards four corners of the rectangular shape along diagonals of the rectangular shape such that the four cut slots in each rectangular shape of the repeated rectangular shaped pattern form four flaps that are able to deflect along four sides of each rectangular shape of the repeated rectangular shaped pattern.

5. A check valve assembly of claim 1, wherein a size of the outlet openings match a size of the square shaped pattern of the check valve film allowing the flaps to deflect.

6. A check valve assembly of claim 5, wherein a size of the inlet openings is smaller than the size of the outlet openings and prevent deflection of the flaps.

7. A check valve assembly for a swappable cooling system, said check valve assembly comprising:
   a check valve film patterned with a plurality of rows and columns of a repeated rectangular shaped pattern, each rectangular shape of the repeated rectangular shaped pattern including a plurality of cut slots, the plurality of cut slots leading to a plurality of triangular deflectable flaps; the deflectable flaps each being non-symmetrical defined by each flap having a shorter free side and longer free side; deflection of the flaps of multiple rectangular shapes in multiple columns and multiple rows of the plurality of rows and columns of the repeated rectangular shaped pattern creating multiple openings in the check valve film for air flow generated by a single exhaust fan of the swappable cooling system to pass through;

a first check valve film holding plate; and a second check valve film holding plate;

the check valve film being sandwiched between the first check valve film holding plate and the second check valve film holding plate;

the first check valve film holding plate having a first framework of spaced structural elements, including a first set of structural elements that are parallel to each other and a second set of structural elements that are parallel to each other and orthogonal to the first set of structural elements of the first framework of spaced structural elements, defining a grid of outlet openings therethrough allowing the plurality of deflectable flaps to deflect, and the second check valve film holding plate having a second framework of spaced structural elements, including a first set of structural elements that are parallel to each other and a second set of structural elements that are parallel to each other and orthogonal to the first set of structural elements of the second framework of spaced structural elements, defining a grid of inlet openings therethrough preventing deflection of the plurality of deflectable flaps towards the side of the second check valve film holding plate; and deflection of the plurality of flaps enabling air flow from a side of the second check valve film holding plate; and preventing the deflection of the plurality of flaps by the second check valve film holding plate prevents air flow from a side of the first check valve film holding plate.

8. A check valve assembly of claim 7, each rectangular shape of the repeated rectangular shaped pattern further incorporating a slot in a centre of the rectangular shape, and four cut slots extending from the slot in the centre towards four corners of the rectangular shape along diagonals of the rectangular shape such that the four cut slots in each rectangular shape of the repeated rectangular shaped pattern form four flaps that are able to deflect along four sides of each rectangular shape of the repeated rectangular shaped pattern.

9. A check valve assembly of claim 7, wherein a size of the outlet openings match a size of rectangular shapes of the repeated rectangular shaped pattern allowing the flaps to deflect.

10. A check valve assembly of claim 9, wherein a size of the inlet openings is smaller than the size of the outlet openings and prevent deflection of the flaps.

* * * * *